United States Patent [19]

Pidgeon, Jr. et al.

[11] Patent Number: 5,471,492
[45] Date of Patent: Nov. 28, 1995

[54] BROADBAND MATCHING NETWORK

[75] Inventors: Rezin E. Pidgeon, Jr., Atlanta; Grover H. Martin, Stone Mountain, both of Ga.

[73] Assignee: Scientific Atlanta, Inc., Norcross, Ga.

[21] Appl. No.: 983,754

[22] Filed: Dec. 1, 1992

[51] Int. Cl.⁶ ...................................................... H01S 3/00
[52] U.S. Cl. ................... 372/38; 372/82; 372/31
[58] Field of Search .................... 372/38, 82, 31

[56] References Cited

U.S. PATENT DOCUMENTS

| | | | |
|---|---|---|---|
| 4,363,126 | 12/1982 | Chenausky et al. | 372/38 |
| 4,809,284 | 2/1989 | Chenausky | 372/82 |
| 4,975,921 | 12/1990 | Rothe | 372/38 |
| 5,008,894 | 4/1991 | Laakmann | 372/82 |
| 5,089,787 | 2/1992 | Wang et al. | 372/82 |
| 5,185,756 | 2/1993 | Olshansky et al. | 372/31 |

OTHER PUBLICATIONS

C. L. Ruthroff, "Some Broadband Transformers" in Proceedings of the IRE, pp. 1337–1342 (Aug. 1959).

*Primary Examiner*—Leon Scott, Jr.
*Attorney, Agent, or Firm*—Banner, Birch, McKie & Beckett

[57] ABSTRACT

A broadband matching network closely matches the output impedance of a broadband amplifier to the input impedance of a laser over a broad frequency band to facilitate efficient transfer of power therebetween. As a result, the broadband amplifier does not have to generate high output power levels that cause intermodulation distortion. The matching network includes a pair of matching transformers having toroidal cores and a filter circuit.

20 Claims, 8 Drawing Sheets

BROADBAND MATCHING NETWORK

BACKGROUND OF THE INVENTION

1. Technical Field

The present invention relates to a broadband matching network, and in particular to a laser communications system having a broadband impedance matching network.

2. Description of the Related Art

In conventional broadband communications systems, such as that depicted in FIG. 1, an amplifier 100 having a 75 Ω output impedance over a broad band of frequencies is applied to a conventional matching network 110. The conventional matching network 110 is comprised of two parallel combinations of a 56 Ω resistor 111, 112 and a 4.7 pF capacitor 413, 414 coupled between the amplifier 100 and a 75 Ω terminating resistor 120. A line between the two parallel combinations is coupled to a laser through a blocking capacitor 130. A direct current (DC) source is coupled to the laser through choke 140. The matching network 110 matches the output impedance of the amplifier 100 to the relatively low impedance of the laser. The resistors 111, 112 consume power wastefully. Accordingly, the amplifier 100 must output a relatively high output power to the matching network in order to drive the laser. Conventional amplifiers become nonlinear when driven to produce higher output power levels. As a result, the signal from one communication channel is degraded by signals from one or more other channels located elsewhere in the frequency band of interest. This is known as intermodulation distortion.

Furthermore, optical communication systems are becoming more expansive. Accordingly, the length of the optical trunk lines are increasing in order to extend service to distant areas. In addition, an increasing number of branch lines are split off from the trunk lines to reach the areas between the trunk lines. To transmit a given number of channels over the longer and increasingly split optical transmission lines, the carrier-to-noise ratio of the transmitted optical signal must be increased to compensate for attenuation. The carrier-to-noise ratio of the transmitted optical signal can be increased by increasing the output power of the amplifier signal. However, increasing the power output of the amplifier to improve the carrier-to-noise ratio also results in increased intermodulation distortion.

The light output power of the laser depends on the bias current applied to the laser and its slope efficiency. The slope efficiency, a characteristic of the particular laser used, is defined as the ratio of the amount of increase in light output power to the amount of increase of radio-frequency (RF) drive current applied thereto. Thus, a laser having a low slope efficiency requires an increased RF drive current to achieve a given output power. In order to produce the increased bias current, the amplifier must be driven to produce a relatively high output power. As above, producing such high output power causes intermodulation distortion in the output signal of the amplifier.

Complex amplifiers must be used to drive the lasers to avoid intermodulation distortion. However, these amplifiers are expensive both to make and to operate. While providing a linear output at relatively high output power levels, these amplifiers consume significantly more power than conventional amplifiers. The consumed power manifests itself as heat, which must be dissipated in order to prevent adverse effects on other components. As a result, the laser system must be provided with structure that dissipates the heat. It is well known from basic transmission theory that any impedance mismatch creates a point of reflection of an applied signal wave. The higher the degree of mismatch, the lower the return loss and the higher the level of reflected power. Some of these principles are described in C. L. Ruthroff, "Some Broad-Band Transformers," Proceedings of the IRE, August 1959, pp. 1137–1342. However, while the concept of broadband impedance matching is known, there remains a need in the art to properly design means for matching the impedance of a known laser device to the output of a radio frequency amplifier. Therefore, there exists a need in the field to provide broadband transmissions having high carrier-to-noise ratio and with low intermodulation distortion as inexpensively as possible.

SUMMARY OF THE INVENTION

It is an object of the present invention to provide a laser system having an impedance matching network that closely matches the impedance of an amplifier to an impedance of a laser driven by the amplifier over a broad frequency band.

It is a further object of the present invention to provide a laser system having an impedance matching network that consumes less power in providing a given RF drive current to a laser.

It is a further object of the present invention to provide a laser system having an impedance matching network that applies a signal having a reduced intermodulation distortion for a given carder-to-noise ratio from a laser.

It is a further object of the present invention to provide a laser system having an impedance matching network that applies a signal with an increased carrier-to-noise ratio to a laser for a given amplifier drive level.

The present invention achieves the above results by providing a laser system including a laser, a driving circuit, and an impedance matching network, including a transformer. The impedance matching network closely matches the output impedance of a broadband amplifier to the input impedance of the laser. As a result, the impedance matching network consumes less power in providing a given RF drive current to a laser. Furthermore, there is no need to drive the broadband amplifier to produce output power levels so high as to cause significant intermodulation distortion from the broadband amplifier because the laser can produce a signal allowing the laser output to have an adequate carrier-to-noise ratio.

The above and further objects and advantages of the invention will become apparent with reference to the detailed disclosure of the invention below and the accompanying illustrative figures.

DETAILED DESCRIPTION OF THE PREFERRED EMBODIMENTS

Figure 1:
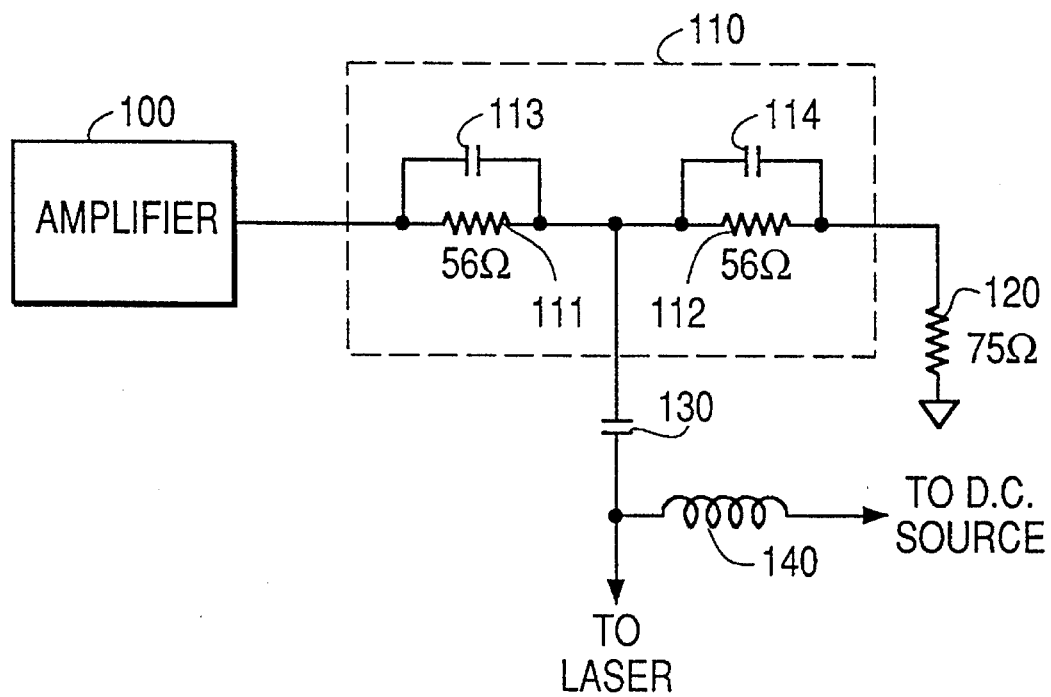
FIG. 1 illustrates the conventional resistive matching scheme for a laser.
Figure 2:
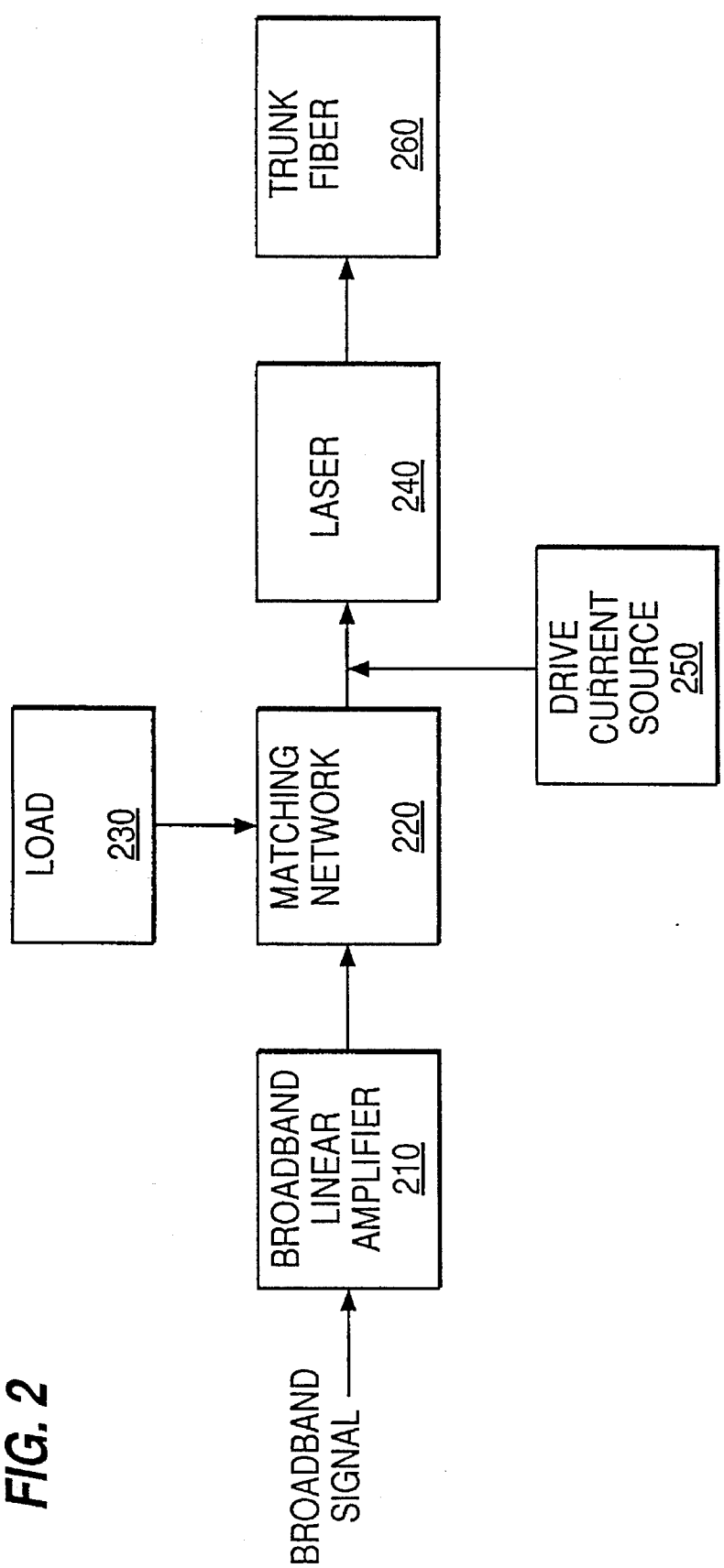
FIG. 2 is a block diagram illustrating a first preferred embodiment of a laser system of the present invention.

FIG. 2 depicts a first embodiment of a laser system of the present invention. A broadband signal is applied to a broadband linear amplifier 210, such as a power doubling amplifier, for example, a 650 MHz Hybrid Driver. The broadband signal is preferably modulated with information over several channels. The broadband linear amplifier 210 amplifies the broadband signal, which, by way of example, may comprise several communications channels in the continuous frequency range of 40–650 MHz. However, this exemplary bandwidth should not be considered limiting. A larger or narrower bandwidth may be utilized consistent with the principles of the present invention. For example, the high frequency end of the transmission band may be 750 MHz, 1 GHz, or more. The broadband linear amplifier 210 has an input impedance and an output impedance. The input and output impedance may be, for example, 75 Ω. The broadband linear amplifier 210 supplies an amplified broadband output signal to an impedance matching network 220. The impedance matching network 220 is additionally coupled to a load 230. Preferably, the load 230 has the same impedance as the output of the broadband linear amplifier 210. The load 230 may be embodied by, for example, a resistor coupled to a reference potential, such as ground potential. The impedance matching network outputs the amplified broadband signal. The amplified broadband signal is combined with a DC current from a DC current source 250 and applied to drive laser 240. In a preferred embodiment, the laser 240 comprises a laser diode, preferably a Mitsubishi FU45SDF-3 laser diode. Responsive to the applied electrical signals, the laser 240 outputs modulated light over a trunk fiber 260 for distribution over a communication network (not shown).

Figure 3:
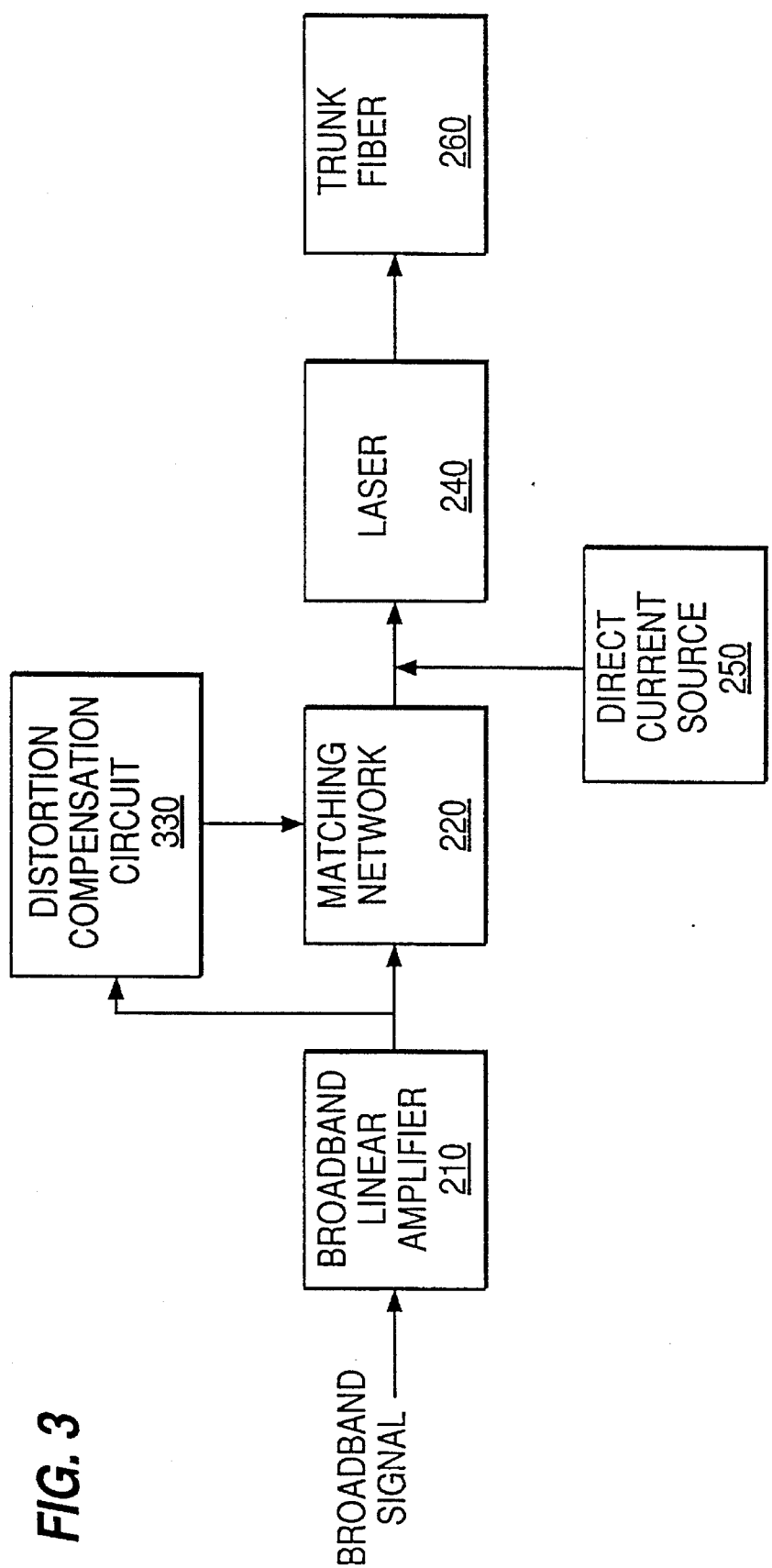
FIG. 3 is a block diagram illustrating a second preferred embodiment of a laser system of the present invention.

FIG. 3 depicts a second preferred embodiment of a laser system of the present invention. Structures common to FIGS. 2 and 3 are labelled with the same reference numerals as in FIG. 2. FIG. 3 includes a distortion compensation circuit 330 that receives the amplified broadband signal from the broadband linear amplifier 210. The distortion compensation circuit modifies the amplified broadband signal to compensate for nonlinearities (such as second and third order nonlinearities) produced by, for example, the laser, the optical trunk line, the receiver of the optical signal, and possibly other components in the communication system. Such a distortion compensation circuit is discussed in commonly assigned application Ser. No. 07/805,251 entitled "Method And Apparatus For Predistortion"; application Ser. No. 07/805,259 entitled "Method And Apparatus For Predistortion"; and application Ser. No. 07/983,754, "Postdistortion Circuit For Reducing Distortion In An Optical Communication System", which are incorporated herein by reference. The distortion compensation circuit 330 supplies the compensated signal to the matching network 220. The remainder of the elements in FIG. 3 generally operate in the same manner as the corresponding elements in FIG. 2.

Figure 4:
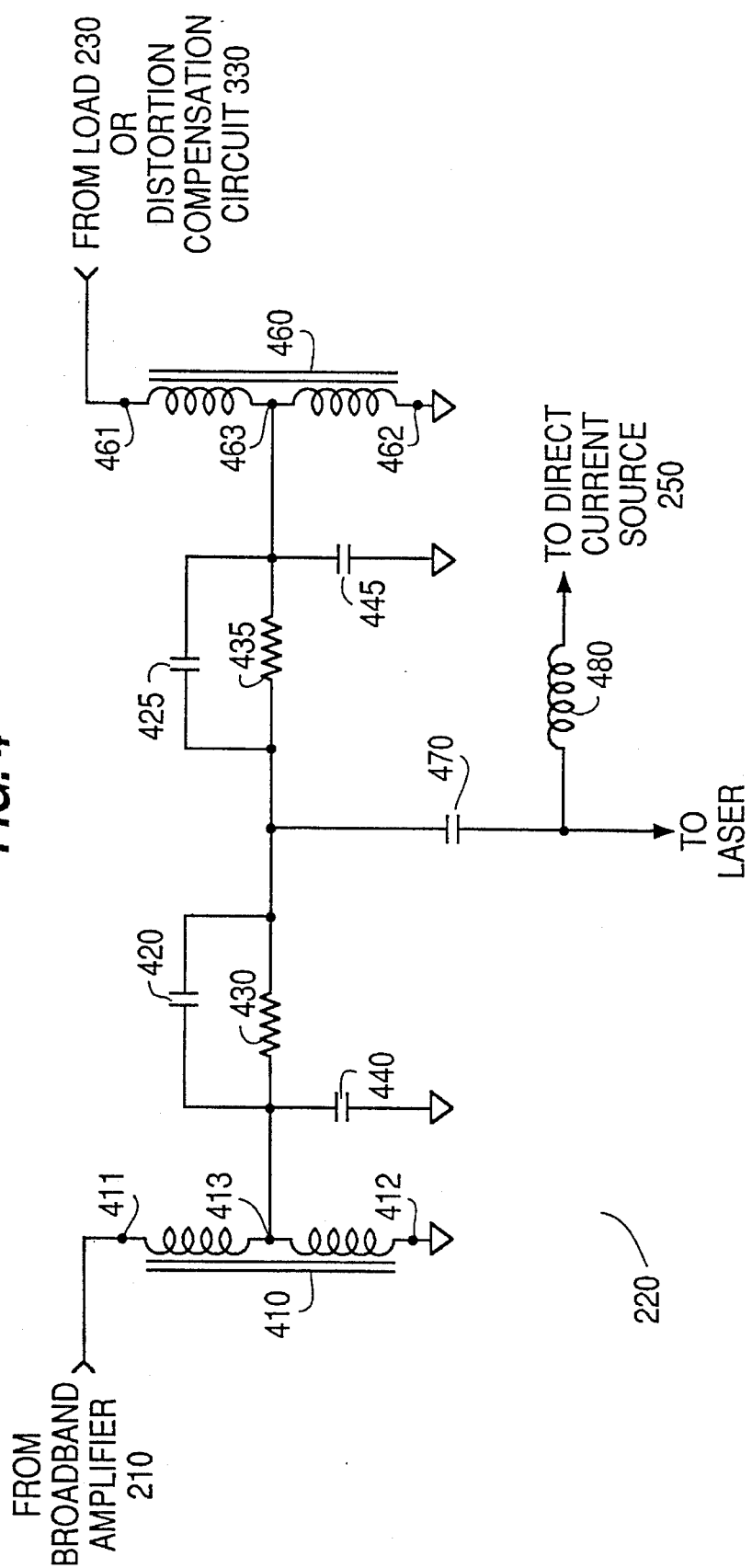
FIG. 4 is a circuit diagram illustrating a preferred embodiment of an impedance matching network of the present invention.

FIG. 4 shows a circuit diagram for the matching network 220 for a preferred embodiment of the present invention. A first terminal 411 of a first transformer 410 receives the amplified broadband signal from the broadband linear amplifier 210. A second terminal 412 of the first transformer 410 is coupled to a reference potential, such as ground potential. A third terminal 413 of the first transformer 410 is coupled to a capacitor 420, a resistor 430, and a capacitor 440. The capacitor 420 and the resistor 430 are additionally coupled to a terminal 450. The capacitor 440 is coupled to the reference potential.

A first terminal 461 of a second transformer 460 is coupled to either the load 230 or the distortion compensation circuit 330. A second terminal 462 of the second transformer 460 coupled to the reference potential. A third terminal 463 of the second transformer 460 is coupled to a capacitor 425, a resistor 435, and a capacitor 445. The capacitor 425 and the resistor 435 are additionally coupled to the terminal 450. The capacitor 445 is coupled to the reference potential. In a preferred embodiment, the resistance value of the resistor 430 and the capacitances of the capacitors 420 and 440 equal the resistance of the resistor 435 and the capacitances of the capacitors 425 and 445, respectively. Similarly, it is preferred that the physical parameters of the transformers 410 and 460 are the same. The resistors 430, 435 and capacitors 420, 425, 440, and 445 form filter circuits. A filter circuit having an alternative structure may also be used consistent with the present invention. In the above description, the filter circuit is formed between the transformers 410, 460. Alternatively, the transformers 410, 460 may be coupled between circuit components of the filter circuit.

The terminal 450 is coupled to the laser 240 for supplying the amplified broadband signal and, with respect to the embodiment of FIG. 3, the compensated signal. In the preferred embodiment, the terminal 450 is coupled through a DC blocking capacitor 470 to the cathode of the laser diode. The cathode of the laser diode is additionally coupled to the drive current source 250 through an RF blocking choke 480. The matching network 220, as well as the capacitor and the choke, are preferably disposed as close as possible to the laser to minimize adverse effects, such as parasitic inductances, attributable to the connecting wires. By minimizing lead lengths to the laser, the transmission loss in the leads and the predictability of the effect of the length on the impedance matching are increased.

Figure 5:
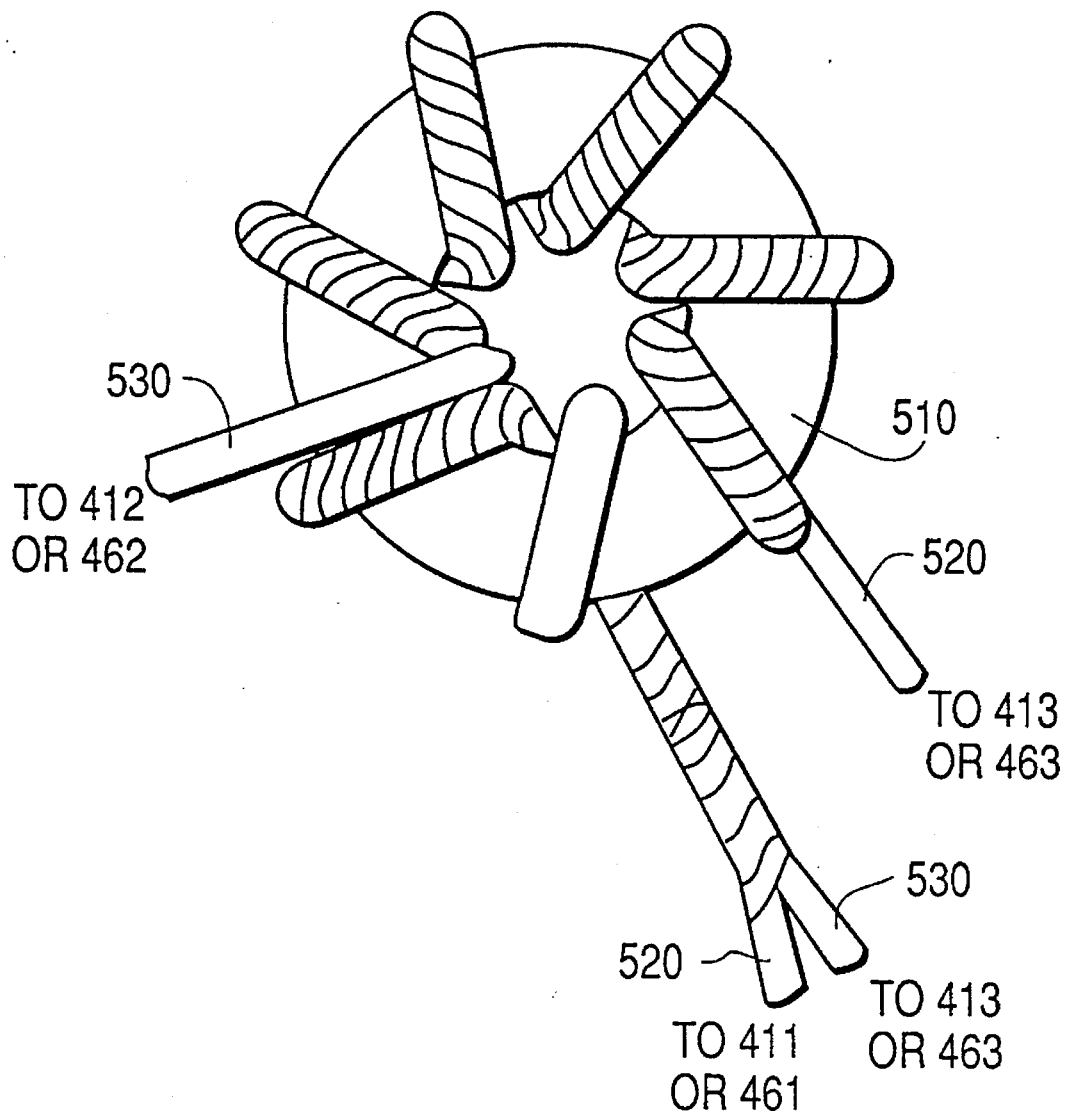
FIG. 5 illustrates a preferred embodiment of an impedance matching transformer of the present invention.

FIG. 5 shows a preferred embodiment of a transformer 410, 460 for use in the matching network 220 of the present invention. The transformer preferably comprises a toroidal core 510 wrapped with a twisted pair of wires 520, 530. Wire 520 is connected between first terminal 411 or first terminal 461 and third terminal 413 or third terminal 463. Wire 530 is connected between third terminal 413 or third terminal 463 and second terminal 412 or second terminal 462. Wires 520, 530 may be connected together the third terminals 413, 463. Alternatively, the transformers 410, 460 may be formed by first wrapping the core 510 with turns of wire, and then wrapping the core with one or more turns of copper tape.

The characteristics of the transformer generally depend on the impedance of the wire, the size of the wire, the size of the core, the core permeability, and the number of turns of wire wrapping the core, among other variables. A change in one of these variables often affects one or more of the other of the variables. The impedance of the wire may be changed by, for example, using a different gauge wire pair or using a pair of twisted wires for each wire of the pair. The size of the wire (i.e. the gauge of the wire) affects the impedance of the wire pair and the size of the core that may be used. For example, a larger wire pair requires a larger core for a given number of turns.

Increasing the size of the core increases the shunt inductance as well as the series inductance. In addition, increasing the size of the core increases the length of wire required to complete a given number of turns of wire about the core. The length of the wire is a variable in determining the optimum match as will be discussed further below. The permeability of the core can be changed by modifying the material of the core, for example. Increasing the permeability of the core results in an increased inductance. In addition, an increased permeability improves the return loss at low frequencies, but degrades the return loss at high frequencies. Increasing the number of turns of wire about the core increases the inductance of the transformer, all other parameters being equal.

By careful selection of the above parameters the optimal impedance of a transformer can be approximated. The optimal matching impedance of the wire for a quarter wavelength in the mid-band is the square root of the product of the output impedance of the circuitry leading to the transformer and the input impedance of the circuitry from the transformer. The quarter wavelength line is a function of the number of turns, the size of the wire, and the size of the core. In a preferred embodiment, the optimal wire-pair impedance of the transformer 410 equals the square root of the product of the output impedance of the broadband linear amplifier 210 and the input impedance of the laser 240 and the resistor 430. The optimal impedance of transformer 460 can be similarly calculated.

Figure 6:
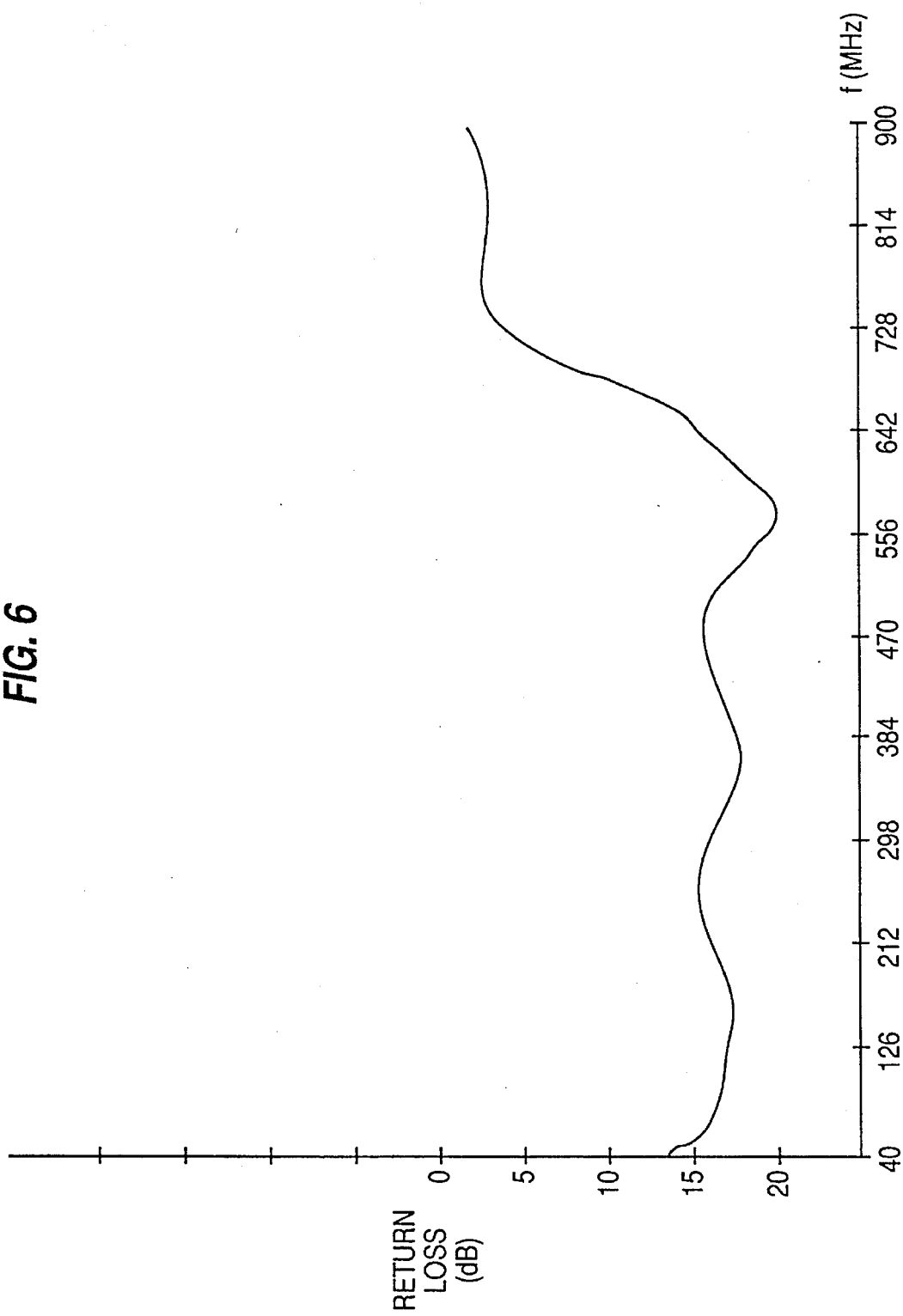
FIG. 6 is a graph of the return loss over a frequency range of interest for a first example of an impedance matching network in the first embodiment of the present invention.

The principles of the present invention can be illustrated by the following examples. In a first example, a preferred value of the resistors 430 and 435 is 20 Ω. The preferred capacitance of the capacitors 420 and 425 is 20 pF, and the preferred capacitance of the capacitors 440 and 445 is 5.6 pF. The transformers 410 and 460 are constructed of 6 turns for the coil between the first terminal 411 and the third terminal 413 and 8 turns for the coil between the third terminal 413 and the second terminal 412. The preferred wire is 30 gauge bi-filar wire having an impedance of 45 Ω. The transformer core is preferably a T16-2 toroidal core manufactured by Micrometals, Inc. ("16" indicating that the exterior diameter of the core is 160 mm and "2" providing an indication of the permeability of the core). A T16-6 core may also be used. FIG. 6 shows the return loss for the embodiment of FIG. 2 between 40 MHz and 900 MHz using a matching network with the above parameters.

Figure 7:
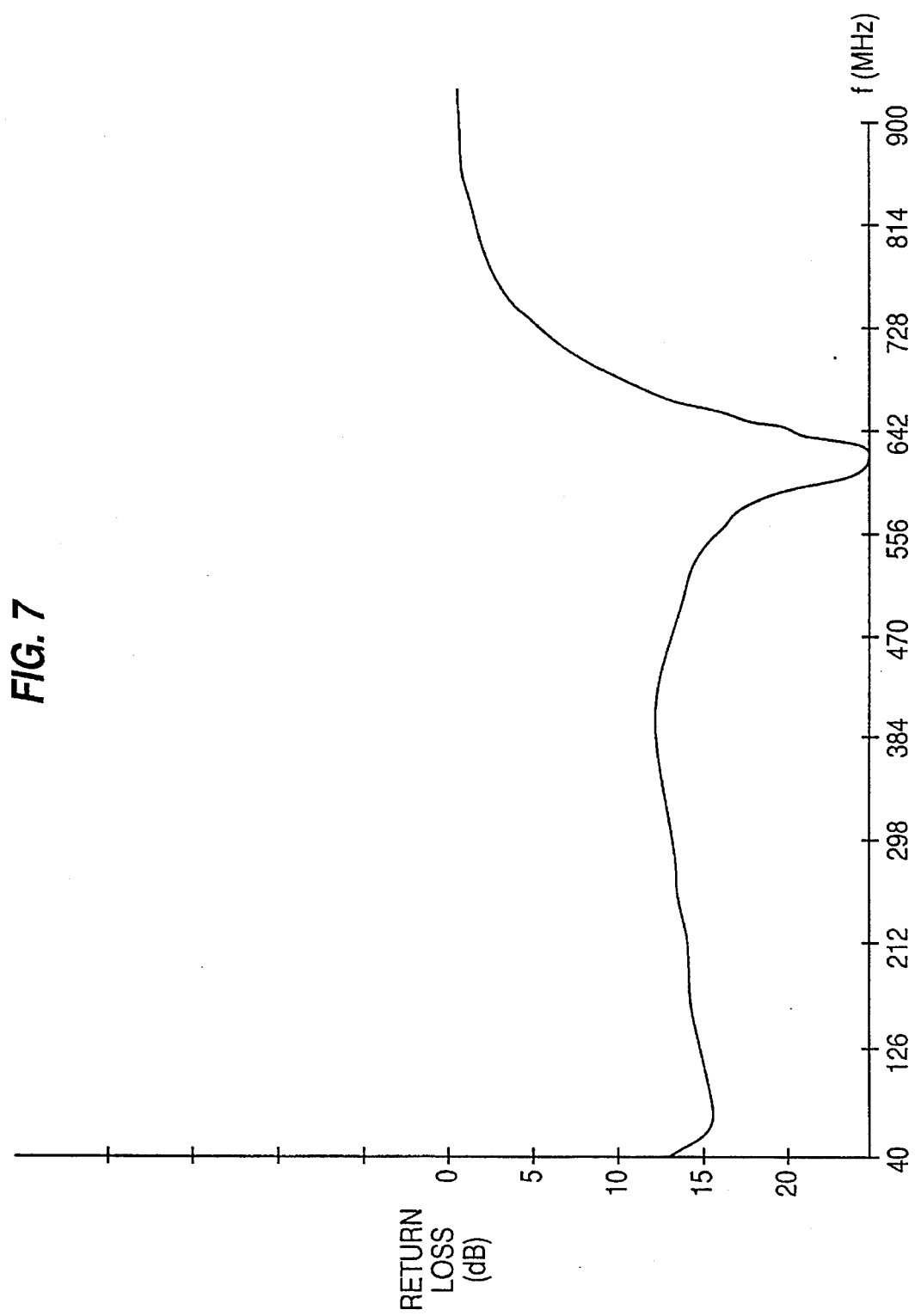
FIG. 7 is a graph of the return loss over a frequency range of interest for a second example of an impedance matching network in the first embodiment of the present invention.
Figure 8:
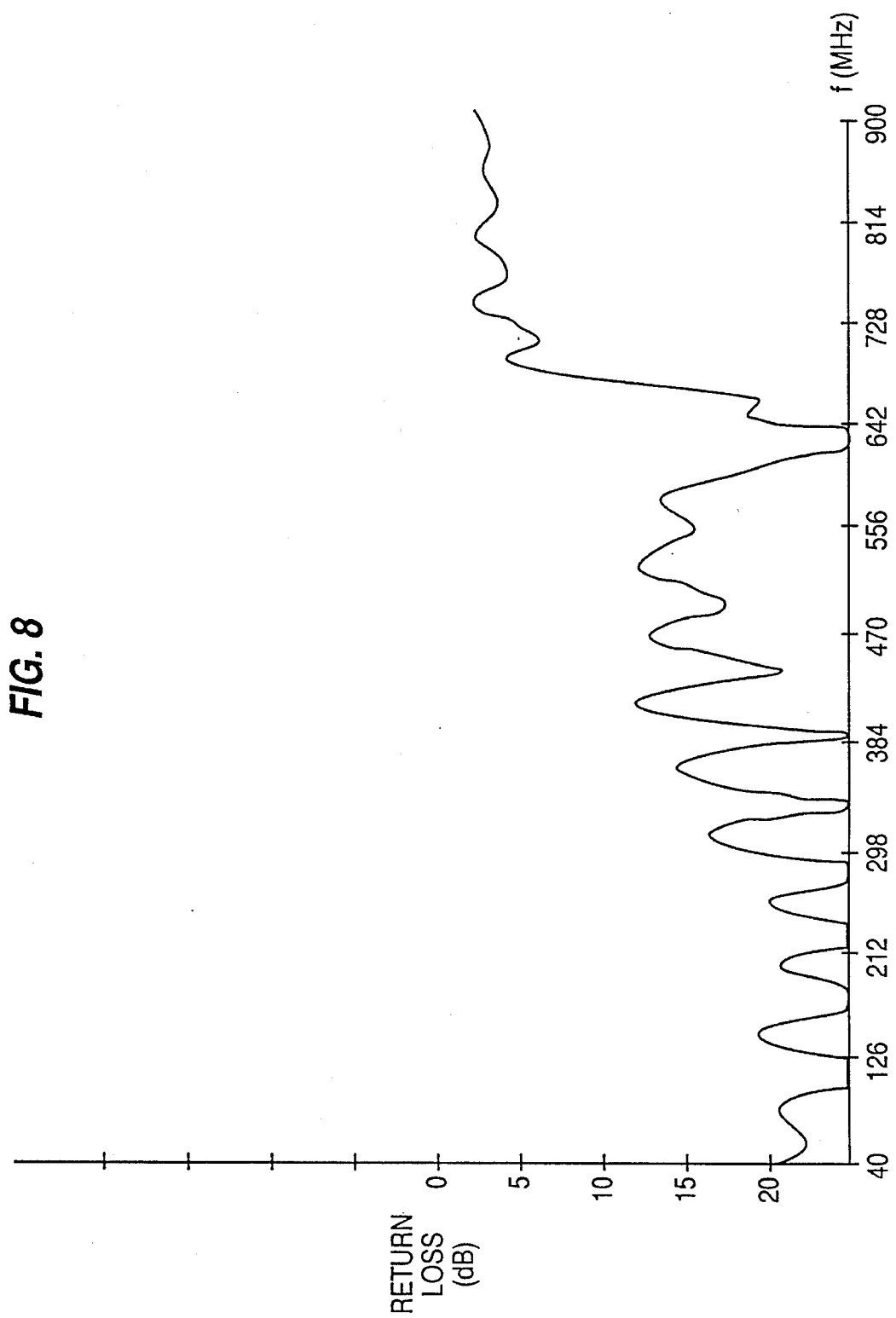
FIG. 8 is a graph of the return loss over a frequency range of interest for the second example of the impedance matching network in the second embodiment of the present invention.

In a second example, a preferred value of the resistors 430 and 435 is 20 Ω. The preferred capacitance of the capacitors 420 and 425 is 18 pF, and the preferred capacitance of the capacitors 440 and 445 is 6.2 pF. The transformers 410 and 460 are constructed of 6 turns for the coil between the first terminal 411 and the third terminal 413 and 8 turns for the coil between the third terminal 413 and the second terminal 412. However, beneficial results may be obtained with 7 or 8 turns, for example. The preferred wire is 36 gauge bi-filar wire having an impedance of 51 Ω. The transformer core is preferably a T12-6 toroidal core. A T16-2 core may be used as well. FIG. 7 shows the return loss for the embodiment of FIG. 2 between 40 MHz and 900 MHz using a matching network with the above parameters. FIG. 8 shows the return loss for the embodiment of FIG. 3 between 40 MHz and 900 MHz using a matching network with the above parameters.

In a third example, the transformers 410, 460 of the present invention can match the output impedance of the broadband linear amplifier 210 to the input impedance of the laser 240 thereby obviating the need for resistors 430, 435 and capacitors 420, 425, 440, and 445. For example, for a 75 Ω amplifier output impedance and a 6–9 Ω laser input impedance, the wire impedance may be selected to be about 27 Ω. This impedance may be obtained by twisting two 36 gauge twisted wire pairs together. The resulting line is wrapped around a T16-2 core 7 times.

Additional modifications and variations will be apparent to those skilled in the art. For example, it is possible to divide a desired transmission bandwidth into two or more transmission bands. A separate matching network feeding a laser may be provided for each of the divided transmission bands. Each matching network may be tuned to match the amplifier to the laser over a narrow transmission bandwidth. Accordingly, transmission over a very broad bandwidth can be achieved with reduced noise. In addition, the matching circuit of the present invention can be used with more expensive amplifiers, such as feed forward amplifiers, to transmit an even broader bandwidth, with increased carrier-to-noise ratio, or with reduced intermodulation distortion.

It should be understood that the invention is not limited to the illustrations described and shown herein which are deemed to be merely illustrative. The invention is intended to encompass all such modifications which are within its spirit and scope defined by the appended claims.

We claim:

1. A laser transmission system comprising:

a laser;

a broadband source for outputting a modulated signal; and an impedance matching network, coupled to said broadband source, for matching the impedance of said laser to the impedance of said broadband source and for supplying the modulated signal to drive said laser the modulated signal facilitating efficient power transfer between said broadband source and said laser such that said broadband source does not generate high output levels that cause intermodulation distortion, said impedance matching network comprising a first transformer, an input terminal of said first transformer coupled to said broadband source, and a filter circuit having a first input terminal coupled to an output terminal of said first transformer and having an output terminal coupled to an input terminal of said laser, said filter circuit outputting the modulated signal from the output terminal to drive said laser.

2. The laser transmission system according to claim 1, wherein said first transformer comprises a toroidal core.

3. The laser transmission system according to claim 1, further comprising a load circuit having an impedance approximately equivalent to said broadband source, and wherein said impedance matching network further comprises a second transformer having an input terminal coupled to said load circuit and an output terminal coupled to a second input terminal of said filter circuit.

4. The laser transmission system according to claim 3, wherein said first transformed and said second transformer comprise a toroidal core.

5. The laser transmission system according to claim 4, wherein said filter circuit comprises:

a first resistor having a first terminal coupled to the output terminal of said first transformer;

a first capacitor having a first terminal coupled to the output terminal of said first transformer;

a second capacitor having a first terminal coupled to the output terminal of said first transformer and a second terminal coupled to a reference potential;

a second resistor having a first terminal coupled to the output terminal of said second transformer;

a third capacitor having a first terminal coupled to the output terminal of said second transformer; and a fourth capacitor having a first terminal coupled to the output terminal of said second transformer and a second terminal coupled to the reference potential, wherein a second terminal of said first and second resistors and a second terminal of said first and third capacitors are coupled to said laser.

6. The laser transmission system according to claim 5, wherein said broadband source comprises a feed forward amplifier.

7. The laser transmission system according to claim 5, wherein said broadband source comprises a power doubling amplifier.

8. The laser transmission system according to claim 5, wherein:

a resistance value of said first resistor is substantially the same as a resistance value of said second resistor;

a capacitance value of said first capacitor is substantially the same as a capacitance value of said third capacitor; and a capacitance value of said second capacitor is substantially the same as a capacitance value of said fourth capacitor.

9. The laser transmission system according to claim 8, wherein said first transformer and said second transformer each comprise a primary winding having 6 turns and a secondary winding having 8 turns.

10. The laser transmission system according to claim 1, wherein said broadband source comprises a feed forward amplifier.

11. The laser transmission system according to claim 1, wherein said broadband source comprises a power doubling amplifier.

12. The laser transmission system according to claim 1, further comprising a compensation circuit, receiving a portion of the modulated signal from said broadband source, for outputting a compensated signal, and wherein said impedance matching network further comprises a second transformer having an input terminal receiving the compensated signal from said compensation circuit and an output terminal coupled to a second input terminal of said filter circuit.

13. The laser transmission system according to claim 12, wherein said first transformer and said second transformer comprise a toroidal core.

14. The laser transmission system according to claim 13, wherein said filter circuit comprises:

a first resistor having a first terminal coupled to the output terminal of said first transformer;

a first capacitor having a first terminal coupled to the output terminal of said first transformer;

a second capacitor having a first terminal coupled to the output terminal of said first transformer and a second terminal coupled to a reference potential;

a second resistor having a first terminal coupled to the output terminal of said second transformer;

a third capacitor having a first terminal coupled to the output terminal of said second transformer; and a fourth capacitor having a first terminal coupled to the output terminal of said second transformer and a second terminal coupled to the reference potential, wherein a second terminal of said first and second resistors and a second terminal of said first and third capacitors are coupled to said laser.

15. The laser transmission system according to claim 14, wherein said broadband source comprises a feed forward amplifier.

16. The laser transmission system according to claim 14, wherein said broadband source comprises a power doubling amplifier.

17. The laser transmission system according to claim 14, wherein:

a resistance value of said first resistor is substantially the same as a resistance value of said second resistor;

a capacitance value of said first capacitor is substantially the same as a capacitance value of said third capacitor; and a capacitance value of said second capacitor is substantially the same as a capacitance value of said fourth capacitor.

18. The laser transmission system according to claim 17, wherein said first transformer and said second transformer each comprise a primary winding having 6 turns and a secondary winding having 8 turns.

19. The laser transmission system according to claim 1, wherein the modulated signal is modulated with information over a plurality of communication channels.

20. The laser transmission system according to claim 19, wherein the communication channels are spread over a continuous frequency range of between 40 MHz and 1 GHz.

* * * * *